(12) United States Patent
Cargonja et al.

(10) Patent No.: US 7,911,182 B2
(45) Date of Patent: Mar. 22, 2011

(54) METHOD AND APPARATUS FOR DETECTING A BATTERY VOLTAGE

(75) Inventors: Nikola Cargonja, San Carlos, CA (US); Joseph S. Chan, Milpitas, CA (US); Don H. Ahn, Sunnyvale, CA (US)

(73) Assignee: Savi Technology, Inc., Mountain View, CA (US)

( * ) Notice: Subject to any disclaimer, the term of this patent is extended or adjusted under 35 U.S.C. 154(b) by 0 days.

(21) Appl. No.: 11/140,586

(22) Filed: May 27, 2005

(65) Prior Publication Data
US 2006/0267555 A1  Nov. 30, 2006

(51) Int. Cl.
*H02J 7/00* (2006.01)
(52) U.S. Cl. .................. 320/133; 320/132; 320/136
(58) Field of Classification Search .......... 320/132, 320/133, 134, 136, 138
See application file for complete search history.

(56) References Cited

U.S. PATENT DOCUMENTS

| | | | |
|---|---|---|---|
| 4,677,363 A | 6/1987 | Kopmann | |
| 4,914,393 A * | 4/1990 | Yoshido | 324/428 |
| 5,025,486 A * | 6/1991 | Klughart | 340/3.1 |
| 5,182,509 A | 1/1993 | Simmonds | |
| 5,600,230 A * | 2/1997 | Dunstan | 340/636.13 |
| 5,675,236 A * | 10/1997 | Nakanishi | 320/136 |
| 5,969,625 A * | 10/1999 | Russo | 340/636.19 |
| 5,973,497 A * | 10/1999 | Bergk et al. | 324/428 |
| 6,091,325 A * | 7/2000 | Zur et al. | 340/455 |
| 6,107,779 A * | 8/2000 | Hara et al. | 320/132 |
| 6,259,232 B1 * | 7/2001 | Douglass et al. | 320/133 |
| 2001/0001533 A1 | 5/2001 | Stuck Andersen et al. | |
| 2003/0220711 A1 | 11/2003 | Allen | |
| 2003/0236656 A1 | 12/2003 | Dougherty | |
| 2004/0164706 A1 | 8/2004 | Osborne | |
| 2004/0233041 A1 | 11/2004 | Bohman et al. | |
| 2005/0007067 A1 | 1/2005 | Baarman et al. | |
| 2006/0197652 A1 | 9/2006 | Hild et al. | |

OTHER PUBLICATIONS

Nikola Cargonja, Joseph S. Chan and Don H. Ahn, U.S. Appl. No. 11/140,587, filed May 27, 2005 for "Method and Apparatus for Monitoring Battery Discharge State".
Nikola Cargonja, Joseph S. Chan and Don H. Ahn, U.S. Appl. No. 11/140,587, filed May 27, 2005 for "Method and Apparatus for Monitoring the Voltage of a Battery".
Liping Julia Zhu and Roderick E. Thorne, U.S. Appl. No. 60/693,200, filed Jun. 23, 2005 for "Method and Apparatus for Conserving Battery Power in RFID Tags".
Liping Julia Zhu and Roderick E. Thorne, U.S. Appl. No. 11/266,019, filed Nov. 3, 2005 for "Method and Apparatus for Battery Power Conservation in Tags".

(Continued)

*Primary Examiner* — Edward Tso
*Assistant Examiner* — Aaron Piggush
(74) *Attorney, Agent, or Firm* — Haynes and Boone, LLP

(57) ABSTRACT

One aspect of the invention involves: maintaining a record of how long a circuit operates in each of a plurality of different operating modes thereof, starting from a point in time at which a battery that powers the circuit is replaced; calculating for each of the operating modes as a function of the record a cumulative current drain from the point in time to a current time; and determining as a function of the cumulative current drains whether the battery is subject to a low voltage condition. Another aspect involves: monitoring a voltage of a battery; periodically determining whether the voltage of the battery is subject to a low voltage condition; and maintaining a count of the number of times that the determining results in a determination that the battery is subject to a low voltage condition.

15 Claims, 4 Drawing Sheets

OTHER PUBLICATIONS

Office Action mailed Jul. 17, 2006 in U.S. Appl. No. 11/140,587, filed May 27, 2005.
Office Action mailed Dec. 6, 2006 in U.S. Appl. No. 11/140,587, filed May 27, 2005.
Office Action mailed Mar. 27, 2007 in U.S. Appl. No. 11/140,587, filed May 27, 2005.
Office Action mailed Jul. 30, 2007 in U.S. Appl. No. 11/140,587, filed May 27, 2005.
Office Action mailed Nov. 9, 2007 in U.S. Appl. No. 11/140,587, filed May 27, 2005.
Notice of Allowance mailed Feb. 5, 2008 in U.S. Appl. No. 11/140,587, filed May 27, 2005.
Office Action mailed Aug. 9, 2007 in U.S. Appl. No. 11/139,428, filed May 27, 2005.
Office Action mailed Jan. 11, 2008 in U.S. Appl. No. 11/139,428, filed May 27, 2005.
Office Action mailed May 1, 2008 in U.S. Appl. No. 11/139,428, filed May 27, 2005.
Office Action mailed Nov. 26, 2008 in U.S. Appl. No. 11/139,428, filed May 27, 2005.
Panel Decision mailed Mar. 10, 2009 in U.S. Appl. No. 11/139,428, filed May 27, 2005.
Office Action mailed Mar. 16, 2009 in U.S. Appl. No. 11/266,019, filed Nov. 3, 2005.

* cited by examiner

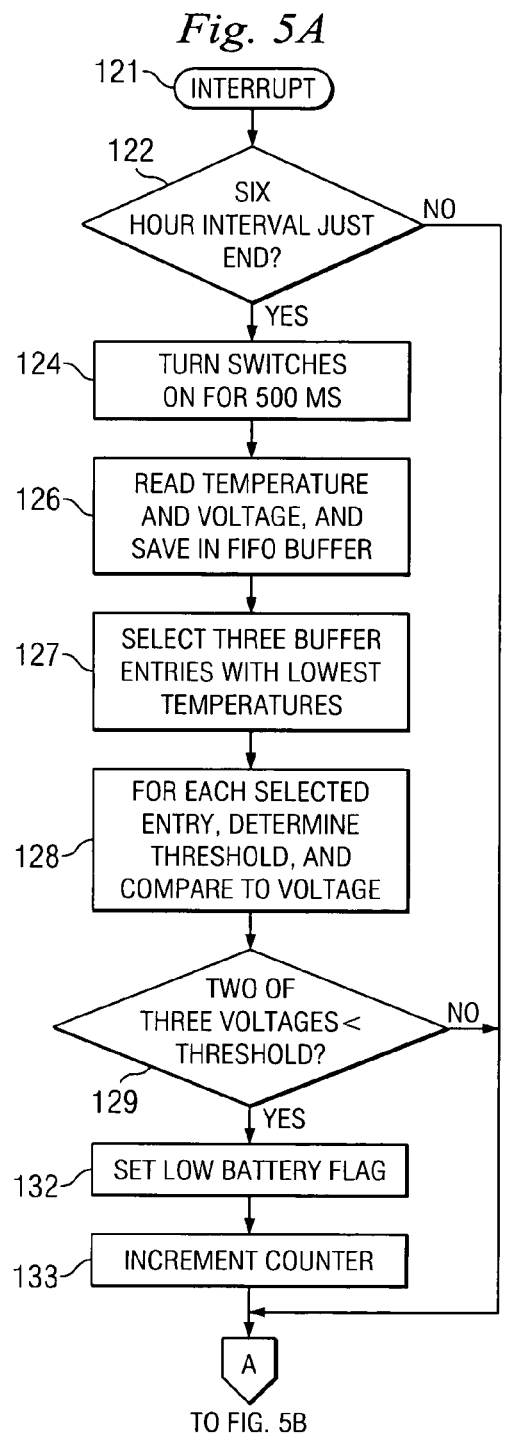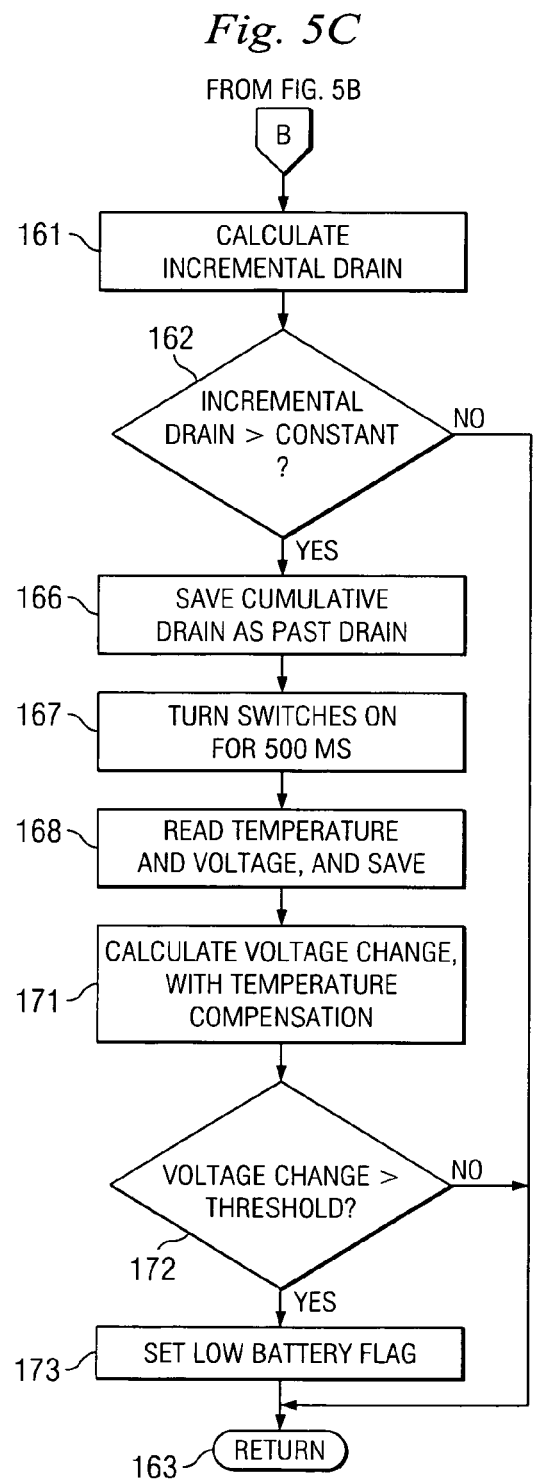

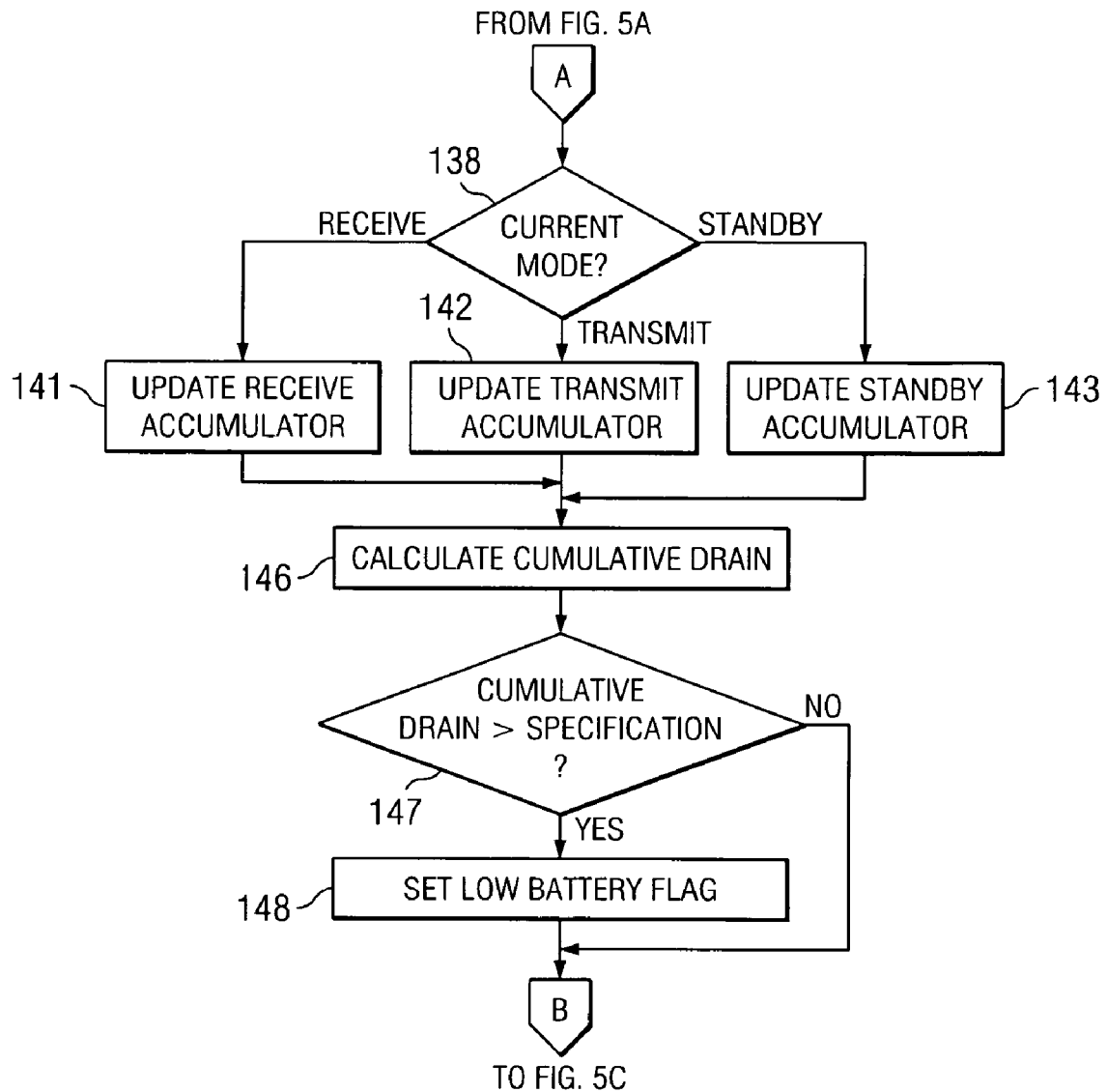

METHOD AND APPARATUS FOR DETECTING A BATTERY VOLTAGE

FIELD OF THE INVENTION

This invention relates in general to batteries and, more particularly, to techniques for monitoring the degree of battery discharge.

BACKGROUND

There are a variety of different types of circuits that are powered by a replaceable battery. Some of these circuits monitor the operational state of the battery, in order to provide an advance warning as the battery is reaching a substantially discharged state, so that the battery can be replaced before it becomes too discharged to operate the circuit.

One particular technology that uses battery-powered circuits is radio frequency identification (RFID) technology. For example, one common use of RFID technology is to track a mobile object, such as a shipping container. A device known as a "tag" is provided on the object to be tracked. The tag typically includes an antenna, circuitry coupled to the antenna, and a battery to power the circuitry. The tag can transmit radio signals, and some tags can also receive radio signals. It is desirable for the circuitry within the tag to be able to accurately monitor the state of the battery so that, as the battery approaches a discharged state, the tag can transmit a radio signal indicating that battery replacement is needed. The battery can then be replaced before it becomes too discharged to operate the circuit.

SUMMARY OF THE INVENTION

One of the broader forms of the invention involves: causing a circuit having a plurality of different operating modes to maintain a record of how long the circuit operates in each of the operating modes, starting from a point in time at which a battery that powers the circuit is replaced; calculating for each of the operating modes as a function of the record a cumulative current drain from battery replacement to a current time; and determining as a function of the cumulative current drains whether the battery is subject to a low voltage condition.

Another of the broader forms of the invention involves: monitoring a voltage of a battery; periodically determining whether the battery voltage is subject to a low voltage condition; and maintaining a count of the number of times that the determining results in a determination that the battery is subject to a low voltage condition.

BRIEF DESCRIPTION OF THE DRAWINGS

A better understanding of the present invention will be realized from the detailed description that follows, taken in conjunction with the accompanying drawings, in which:

FIG. 5 is a flowchart diagrammatically depicting a different part of the program executed by the processor.

DETAILED DESCRIPTION

Figure 1:
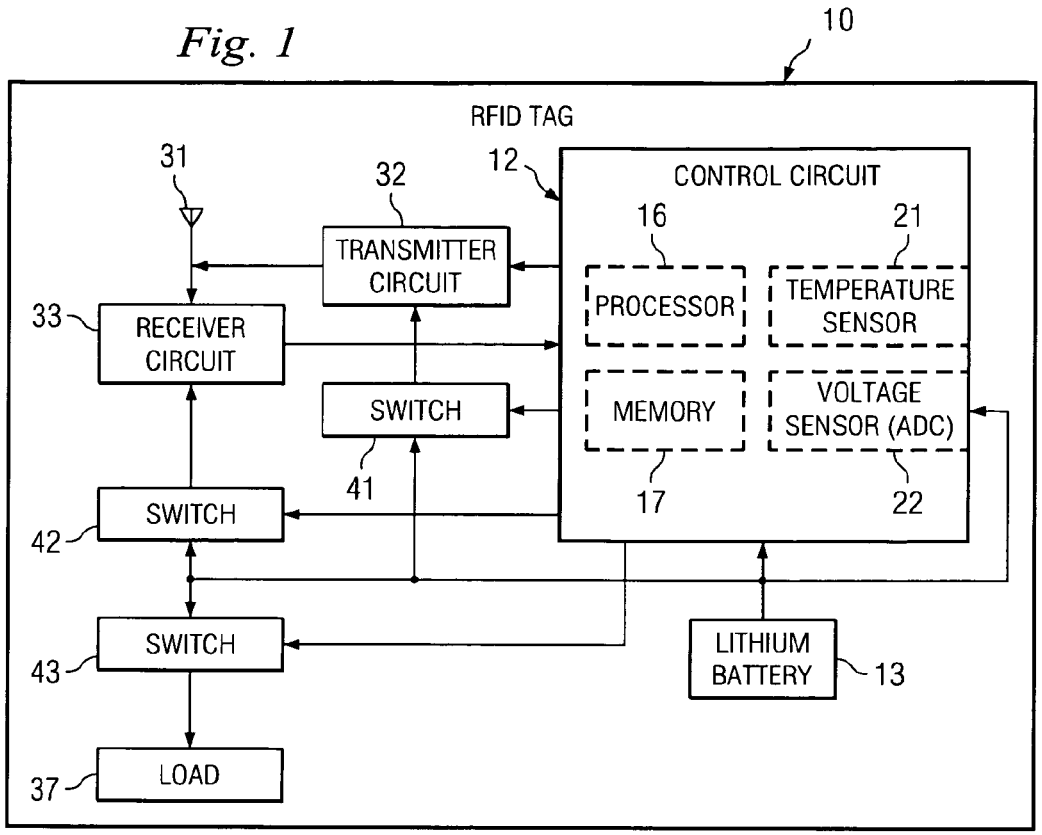
FIG. 1 is a block diagram showing an apparatus that is a radio frequency identification (RFID) tag.

FIG. 1 is a block diagram showing an apparatus that is a radio frequency identification (RFID) tag 10. FIG. 1 does not show all of the details of the tag 10, but instead shows selected portions of the tag that facilitate an understanding of various aspects of the present inventions.

The tag 10 includes a control circuit 12, and a lithium battery 13. The battery 13 provides operating power to the control circuit 12. In the disclosed embodiment, the battery 13 is a replaceable lithium-thionyl chloride (Li—SOCl$_2$) cell that is available commercially as part number LS14500 from SAFT of Bagnolet, France. However, it would alternatively be possible to use any of a variety of other commercially-available lithium batteries. Certain aspects of the invention are advantageous when used in association with a lithium battery, especially a lithium-thionyl chloride battery. However, the invention is not restricted to lithium batteries, and it would alternatively be possible to use some other type of battery technology, including technologies that may be developed in the future.

The control circuit 12 includes a processor 16 of a known type. Further, the control circuit 12 includes a memory 17. In FIG. 1, the block that represents the memory 17 is intended to collectively represent all of the various different types of memory that are present in the control circuit 12. For example, the memory 17 includes a read-only memory (ROM) and a random access memory (RAM). The ROM contains a program that is executed by the processor 16, as well as static data that does not change during program execution. The RAM stores data and other information that varies dynamically during program execution. The memory 17 may also include other types of memory, such as a flash RAM.

The control circuit 12 includes a temperature sensor 21 that measures the ambient temperature of the environment within which the tag 10 is currently located. In the disclosed embodiment, the control circuit has an integrated circuit with an internal diode junction that serves as the temperature sensor 21, and that is calibrated during the manufacture of the control circuit 12. However, it would alternatively be possible to implement the temperature sensor 21 with any of a wide variety of other commercially-available devices.

The control circuit 12 also includes a voltage sensor 22. The voltage sensor 22 monitors the voltage produced by the lithium battery 13, and this information is in turn used to monitor the level of discharge of the battery, in a manner discussed in more detail later. In the disclosed embodiment, the voltage sensor 22 is an analog-to-digital converter (ADC) of a known type, with a tolerance of approximately 50 mv. However, it would alternatively be possible to use a different ADC having a different tolerance, or any other suitable type of voltage sensor.

The tag 10 includes an antenna 31, a transmitter circuit 32 and a receiver circuit 33. The transmitter circuit 32 is coupled between the control circuit 12 and the antenna 31, and the control circuit 12 can transmit radio frequency signals through the transmitter circuit 32 and the antenna 31. The receiver circuit 33 is coupled between the control circuit 12 and the antenna 31, and the control circuit 12 can receive radio frequency signals through the antenna 31 and the receiver circuit 33.

The tag 10 also includes a resistive load 37, and three electronic switches 41, 42 and 43. The electronic switches 41-43 are controlled independently of each other by the control circuit 12. The switch 41 is used to selectively supply power from the battery 13 to the transmitter circuit 32, the switch 42 is used to selectively supply power from the battery 13 to the receiver circuit 33, and the switch 34 is used to selectively couple the resistive load 37 to the battery 13.

The tag 10 has a plurality of operational modes, including a transmit mode, a receive mode and a standby mode. In the transmit mode, the switch 41 is turned on and the switches 42 and 43 are turned off. Thus, the transmitter circuit 32 draws power from the battery 13, but the receiver circuit 33 and the load 37 do not. In the receive mode, the switch 42 is turned on, and the switches 41 and 43 are turned off. Thus, the receiver circuit 33 draws power from the battery 13, but the transmitter circuit 32 and the load 37 do not. In the standby mode, the switches 41, 42 and 43 are all disabled. Thus, none of the transmitter circuit 32, the receiver circuit 33 or the load 37 draws any power from the battery 13. In order to conserve the power of the battery 13, the transmitter circuit 32 and the receiver circuit 33 are each turned on only when they need to be on.

Figure 2:
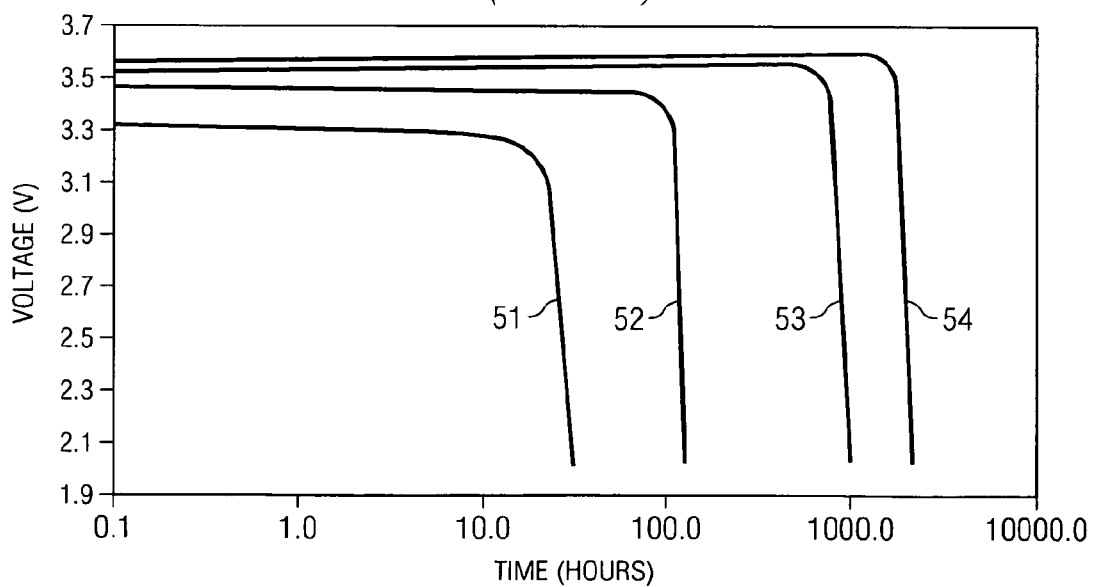
FIG. 2 is a graph showing certain inherent characteristics of a lithium battery that is a component of the tag of FIG. 1.

As discussed above, the battery 13 in the disclosed embodiment is a commercially-available lithium battery. FIG. 2 is a graph showing certain inherent characteristics of the lithium battery 13. In particular, FIG. 2 depicts variation in battery voltage over time, in the form of four curves 51-54 that each represent a respective discharge profile at a temperature of 20° C. In particular, the curve 51 represents a situation where a load of 56 ohms is continuously applied across the battery, resulting in a continuous current drain of 57 ma. The curve 52 represents a situation where a load of 200 ohms is continuously applied across the battery, resulting in a continuous current drain of 17 ma. The curve 53 represents a situation where a load of 1,500 ohms is continuously applied across the battery, resulting in a continuous current drain of 2.4 ma. The curve 54 represents a situation where a load of 3,500 ohms is continuously applied across the battery, resulting in a continuous current drain of 1 ma. Beginning at the left end of each of the curves 51-54, it will be noted that the initial rate of voltage decrease is almost zero. Later, as the battery approaches its discharged state, each curve has a corner or knee, after which the voltage decreases at a relatively rapid rate.

Figure 3:
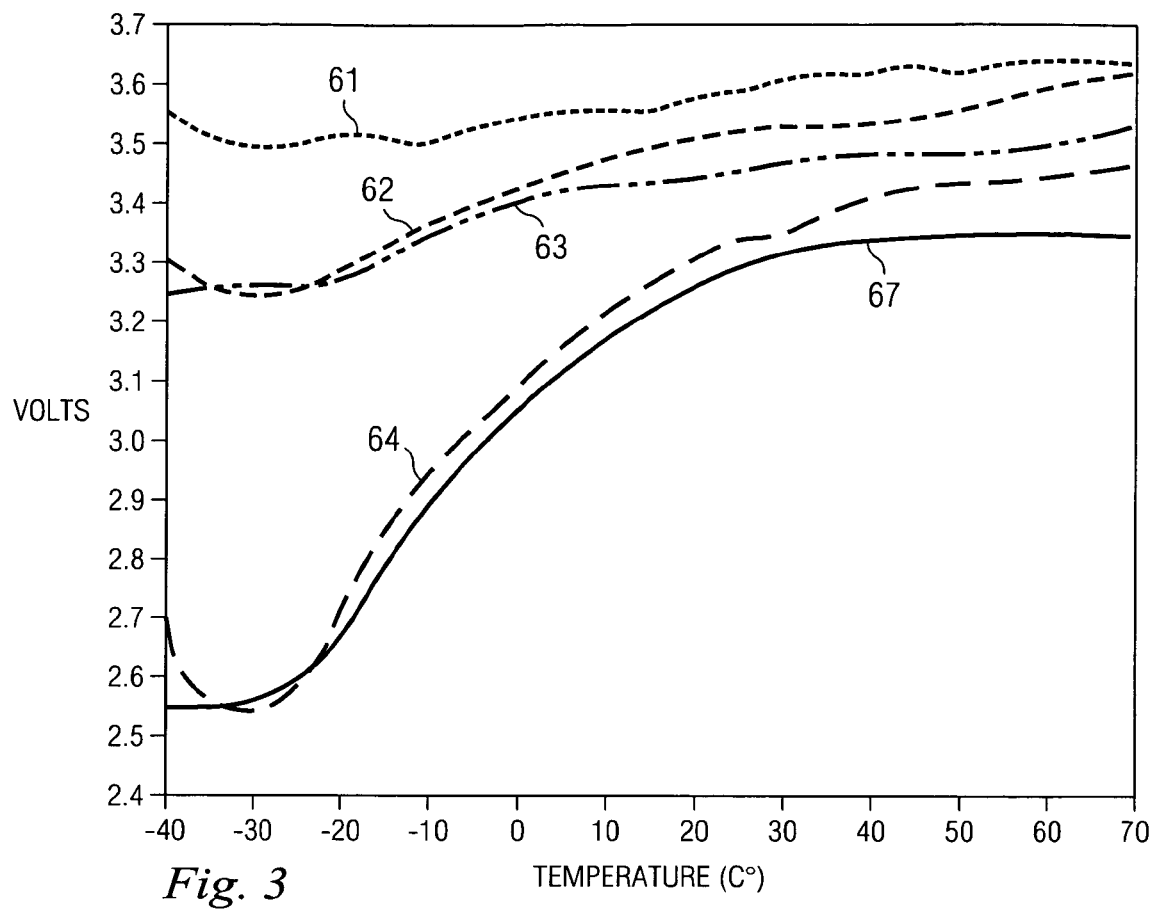
FIG. 3 is a graph showing how the voltage of the battery varies with temperature, under different load conditions.

As mentioned above, FIG. 2 assumes a constant temperature of 20° C. FIG. 3 is a graph showing how the voltage of the battery 13 varies with changing temperature, under different load conditions. More specifically, curves 61 and 62 respectively correspond to the battery being fully charged and 90% discharged, and each show how battery voltage varies with changing temperature while a load of 820 ohms is applied across the battery 13. It should be noted that, at a temperature of 40° C., there is a difference of only about 100 mv between the respective voltages exhibited by the battery 13 when fully charged and when 90% discharged. In contrast, at a temperature of −30° C., the battery has a larger voltage differential of approximately 200 mv. Similarly, curves 63 and 64 respectively correspond to the battery being fully charged and 90% discharged, and each show how battery voltage varies with changing temperature while a load of 82 ohms is applied across the battery 13. At 40° C., the voltage differential between the curves 63 and 64 is less than 100 mv. In contrast, at a temperature of −30° C., the voltage differential between the curves 63 and 64 is approximately 700 mv.

As discussed above, the voltage differential between a fully charged battery and a 90% discharged battery is larger at lower temperatures. As also discussed above, the voltage sensor 22 of FIG. 1 uses an ADC to measure voltage. With any ADC, it is easier to accurately measure the voltage when the differential is large than when the differential is small. As mentioned earlier, the ADC in the voltage sensor 22 of FIG. 1 has a tolerance of approximately 50 mv, which is not significantly smaller than the voltage differentials exhibited by the battery 13. Consequently, in order to increase the accuracy of the monitoring of the voltage of the battery 13, and thus the accuracy of the monitoring of the discharge state of the battery, it is advantageous to sample the battery voltage at the time each day when the ambient temperature is lowest.

The lowest temperature typically occurs at night. However, during normal operational use, the tag 10 may be transported to almost any place in the world, for example in an airplane or a ship that carries numerous shipping containers. There is no simple and accurate way for the tag to determine when night occurs. Therefore, as discussed in more detail later, the tag 10 samples the battery voltage on a periodic basis, for example every 6 hours, or in other words 4 times a day. Of these 4 daily voltage samples, one will usually be taken at a temperature lower than the temperatures at which the other three samples are taken. Accordingly, this sample represents a more accurate measurement of the current voltage of the battery 13. The manner in which this sampling is carried out is discussed in more detail later.

In FIG. 3, curve 67 represents a threshold or limit curve. In particular, for any given temperature, the measured voltage of the battery 13 under any load condition can be compared to the threshold or limit value defined for that particular temperature by the curve 67. If the measured voltage is less than the threshold or limit value, then the battery 13 may have reached a low voltage condition in which it is sufficiently discharged so that it needs to be replaced.

Figure 4:
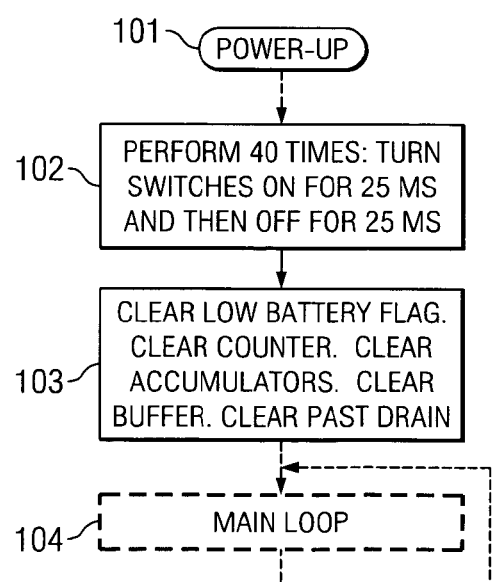
FIG. 4 is a flowchart diagrammatically depicting part of a program executed by a processor that is a component of the tag of FIG. 1.

FIG. 4 is a flowchart that diagrammatically represents part of the program that is executed by the processor 16 in the tag 10 of FIG. 1. In FIG. 4, block 101 represents a point in time when the circuitry in the tag 10 is powered up, in particular due to insertion of a new battery 13 during a battery replacement. Following this power up, the processor 16 carries out some self-test and initialization routines. At some point during these initialization routines, the program reaches block 102, where it performs a specific on/off cycle 40 times in a row. In particular, the processor 16 of the control circuit 12 turns the electronic switches 42 and 43 on for 25 ms, so that newly-inserted battery 13 is supplying power to the receiver circuit 33 and the load 37. This produces a known current drain from the battery 13. Then, the processor 16 causes the control circuit 12 to turn the electronic switches 42 and 43 off for 25 ms, so that the receiver circuit 33 and load 37 are not drawings any power from the battery 13. This on/off cycle of 25 ms on and 25 ms off is carried out 40 times, during a time period of 2 seconds.

The reason is that, when a lithium battery has been sitting on the shelf for a period of time, without being used, an oxidation or passivation layer can develop within the battery, and has the effect of increasing the internal resistance of the battery. Consequently, since the internal resistance is artificially increased, voltage readings from the tag will be inaccurate because they will be artificially decreased, at least until the passivation layer dissipates. The 2-second period of 40 on/off cycles has the effect of eliminating the passivation layer within the battery 13, so that when later portions of the program measure the voltage of the battery, the voltage readings will be accurate. Performing this on/off cycle 40 times has been found through experimentation to remove the passivation layer more rapidly than just turning the switches 42 and 43 on continuously for the 2 second period. Further, cycling the switches 42 and 43 on and off is more efficient, because use of the 50% duty cycle drains less charge from the battery 13 than a 100% duty cycle.

From block 102, the program proceeds to block 103, where the program initializes several different variables that will be used during program execution. In particular, the program clears a software flag that identifies the existence of a low battery condition, because the program knows that a new battery has just been inserted, and assumes that this battery is fully charged. In addition, the program clears a counter, a buffer and several accumulators, each of which will be discussed in more detail later. After completing block 103, and any remaining initialization, the program enters a main loop, as indicated diagrammatically at 104 in FIG. 4.

FIG. 5 is a flowchart that represents a different portion of the program executed by the processor 16 of FIG. 1. More specifically, the flowchart of FIG. 5 represents an interrupt service routine that is automatically executed at regular intervals, for example every 0.1 second. Each time the underlying interrupt is generated, the processor 16 interrupts its execution of the main loop 104 in FIG. 4, executes the interrupt service routine in FIG. 5, and then resumes execution of the main loop 104 from the point where the interrupt occurred.

Execution of the interrupt service routine of FIG. 5 begins at block 121, and proceeds to block 122. At block 122, a determination is made as to whether a 6-hour time interval has just ended. Typically, the program will find that a 6-hour interval has not just ended, and will proceed from block 122 directly to block 138, which is discussed later. However, once every 6 hours, the program will determine at block 122 that a 6-hour time interval has just ended, and will then proceed to block 124.

In block 124, the control circuit 12 turns the electronic switches 42 and 43 continuously on for a time period of 500 ms. This causes power to be supplied from the battery 13 to each of the receiver circuit 33 and the load 37, thereby imposing a known current drain on the battery 13. The reason is that, when a lithium battery is subject to a relatively low current drain, for example when driving a load of 820 ohms or more, the battery can act like a large capacitor and accumulate excess charge. The excess charge can in turn cause the voltage of the battery to be artificially increased, such that a measurement of the battery voltage will not be accurate. If the measured battery voltage is not accurate, then it will interfere with accurate determination of the actual level of discharge of the battery.

Consequently, to avoid this problem, a selected load is applied to the battery 13 just before the battery voltage is measured, in order to dissipate any excess charge that may have accumulated within the battery. In particular, the control circuit 12 turns on the electronic switches 42 and 43 for 500 ms, so that the battery 13 is supplying power to the receiver circuit 33 and the load 37. In other words, a known load is continuously applied to the battery for 500 ms, in order to remove the excess charge that would otherwise interfere with accurate measurement of the battery voltage.

From block 124, program execution proceeds to block 126, where the control circuit 12 uses the temperature sensor 21 to detect the ambient temperature, and uses the voltage sensor 22 to detect the current voltage of the battery 13. In the disclosed embodiment, this results in a sample that contains both the measured voltage value and the measured temperature value, and this sample is saved in a first-in-first-out (FIFO) buffer. This FIFO buffer is the buffer that was cleared during system initialization, in block 103 of FIG. 4. In the disclosed embodiment, the FIFO buffer can store 24 samples. Since the samples are being taken at 6-hour intervals, or in other words 4 times each day, the FIFO buffer can hold up to 24 samples taken over a time frame of 6 days. Once the FIFO buffer is full, and contains 24 successive samples, each new sample saved in the buffer replaces the oldest sample that had been in the buffer up to that point.

From block 126, the program proceeds to block 127, where it reviews the 24 samples or entries stored in the buffer, and then selects the three samples in the buffer that have the lowest temperature values. Then, at block 128, the program takes one of the three samples in this subset, uses the temperature value of that sample to identify a corresponding threshold voltage from the curve 67 of FIG. 3, and then determines whether the measured voltage value in the sample is less than the threshold voltage identified for that sample. The program then repeats this evaluation for the other two samples selected for the subset.

Then, at block 129, the program determines whether the voltage values in at least two of the three selected samples were determined to be less than the corresponding threshold values from the curve 67. If not, the program proceeds directly to block 138, which is discussed later. On the other hand, if two of the three voltage values are determined to be below their respective threshold values, then this represents a determination that the battery 13 has a low voltage condition, or in other words that the battery is substantially discharged. The program then proceeds from block 129 to block 132, where it sets the low battery flag in order to indicate that a low voltage condition has been detected.

In the disclosed embodiment, once the program has set the low battery flag, the flag remains set until the battery 13 is replaced. When the battery 13 is replaced, the flag will be reset, as discussed above in association with block 103 of FIG. 4. Alternatively, however, it would be possible to reset the low battery flag if there is a change in the condition that set the flag. For example, with reference to FIG. 5, if it was determined at block 129 that none of the three voltage values are below the threshold, or that only one voltage value is below the threshold, then the low battery flag and the counter could both be cleared.

From block 132, the program proceeds to block 133, where it increments the counter. This is the counter that was cleared in block 103 of FIG. 4. The number in the counter represents the number of times that the program determined in block 129 that the current battery has a low-voltage condition. The number in the counter will progressively increase, and serves as an indication of the progressively increasing degree of urgency for replacing the battery 13.

With reference to FIG. 1, a not-illustrated reader of a known type is disposed at a location spaced from the tag 10, and can send a radio signal to the tag 10 through the antenna 31 and receiver 33. In response to receipt of this signal, the tag 10 uses the transmitter circuit 32 and antenna 31 to send a radio signal that indicates the state of the low battery flag, and also the number in the counter. After receiving this type of signal from each of a number of different tags, the not-illustrated reader can determine which tags need a battery replacement, and also the relative degree of urgency for replacing the battery in each of these tags. The reader can then prioritize the order in which a technician is instructed to replace the discharged batteries in respective different tags.

From block 133, the program proceeds to block 138. As discussed above, the control circuit 12 can operate in three different operational modes, including a receive mode, a transmit mode and a standby mode. In block 138, the program determines which of these three operational modes is the current operational mode of the control circuit 12, and then proceeds to a corresponding one of three blocks shown at 141, 142 and 143.

In particular, if the control circuit 12 is currently in the receive mode, the program proceeds from block 138 to block 141, where the program updates a receive accumulator, which is one of the accumulators that was cleared in block 103 of FIG. 4. The receive accumulator contains a number representing the cumulative amount of time that the control circuit 12 has spent in the receive mode since the battery 13 was last replaced. In the disclosed embodiment, the receive accumulator is updated by incrementing the number in it. Thus, for example, if the interrupt service routine of FIG. 5 is executed every 0.1 seconds, the receive accumulator will contain a number that represents how many 0.1 second time intervals the program has spent in the receive mode.

If it is determined in block 138 that the current operational mode is the transmit mode, then the program will proceed from block 138 to block 142, where it updates a transmit accumulator. The transmit accumulator is another of the accumulators that was previously cleared at block 103 in FIG. 4. The transmit accumulator contains a number representing the cumulative amount of time that the control circuit 12 has spent in the transmit mode since the battery 13 was last replaced.

As yet another alternative, if the program determines at block 138 that the current operational mode is the standby mode, then the program proceeds from block 138 to block 143, where it updates a standby accumulator. The standby accumulator is still another of the accumulators that was cleared at block 103 in FIG. 4. The standby accumulator contains a number representing the cumulative amount of time that the control circuit 12 has spent in the standby mode since the battery 13 was last replaced.

At any given point in time, the control circuit 12 will be operating in one of the receive, transmit and standby modes. Accordingly, it will be recognized that the receive, transmit and standby accumulators collectively represent the total amount of time that has elapsed since the battery 13 was last replaced.

From any of blocks 141, 142 and 143, the program proceeds to block 146, where it calculates an estimate of the cumulative amount of current that has been drained from the battery 13 since the battery 13 was last replaced. In this regard, for each of the receive, transmit and standby modes, the program knows the respective different levels of current that are drained from the battery 13. Therefore, since the accumulators represent the respective different amounts of time that the control circuit has spent in each of these three modes, it is possible for the program to calculate an estimate of the cumulative amount of current that has been drained from the battery since the battery was replaced. For example, one suitable form of this calculation can be expressed mathematically as:

$$D_C = (K \cdot A_R \cdot D_R) + (K \cdot A_T \cdot D_T) + (K \cdot A_S \cdot D_S)$$

where $D_C$ is the cumulative current drain from the battery, $A_R$ is the value in the receive accumulator, $A_T$ is the value in the transmit accumulator, $A_S$ is the value in the standby accumulator, $D_R$ is the current drain in the receive mode, $D_T$ is the current drain in the transmit mode, $D_S$ is the current drain in the standby mode, and K is a constant that converts the number in each accumulator into seconds. Thus, $$T = K(A_R + A_T + A_S),$$

where T is the total time that has elapsed since the battery 13 was last replaced.

From block 146, the program proceeds to block 147, where it compares the calculated cumulative current drain $D_C$ to an operational specification for the battery, in order to determine whether the calculated cumulative current drain $D_C$ from the battery is in excess of the specified amount of current drain that would typically put the battery in a substantially discharged state. If the calculated cumulative current drain $D_C$ is greater than the specified current drain, then the battery 13 is assumed to have reached a substantially discharged state. The program therefore proceeds to block 148, where it sets the low battery flag, and then proceeds to block 161. On the other hand, if the program determines at block 147 that the calculated cumulative current drain $D_C$ is less than the specified value, the program assumes that there has not yet been enough cumulative current drain to substantially discharge the battery. The program therefore proceeds directly from block 147 to block 161.

Past drain is a previous value of the calculated cumulative drain, as discussed below. In block 161, the program takes the cumulative drain value calculated in block 146, and subtracts from it the past drain value, in order to obtain an incremental drain value. Then, in block 162, the program compares the incremental drain value to a constant. In block 162, the program is identifying points in time, where the amount of current drained from the battery between any two successive points in time is equal to the constant. In other words, different pairs of successive points will be separated by respective different time intervals, but the amount of current drained from the battery between each pair of successive points will be the same.

In block 162, if the calculated value for the incremental current drain has not yet reached the constant value, then the program has not yet found the next point in time that it currently is looking for, because not enough current has been drained from the battery since the last identified point in time. The program therefore proceeds from block 162 to block 163. In block 163, the program exits the interrupt service routine of FIG. 5, and resumes execution of the main loop 104 of FIG. 4, from the point where that main routine was interrupted. On the other hand, if it is determined in block 162 that the incremental current drain has reached the constant value, then the program has found the next point in time that it currently is looking for, because a selected amount of current has been drained from the battery since the last identified point in time. The program therefore proceeds from block 162 to block 166.

In block 166, the program saves the cumulative drain value calculated in block 146 as the past drain value, so that the program will have a basis for looking for the next point in time that it needs to identify. Next, in block 167, the program turns the electronic switches 42 and 43 continuously on for a time period of 500 ms, in a manner similar to that discussed above in association with block 124. Then, in block 168, the program uses the temperature sensor 21 to detect the ambient temperature, and uses the voltage sensor 22 to detect the current voltage of the battery 13. These measured temperature and voltage values are then saved, but not in the FIFO buffer that was discussed earlier. These measured values represent the temperature and voltage values that existed at the point in time just identified by the program in block 162.

Next, in block 171, the control circuit 12 calculates the change that has occurred in the measured battery voltage between the current point in time just identified in block 162, and the most recent point in time that was previously identified in block 162. In order to accurately calculate this voltage change, the control circuit 12 must carry out temperature compensation for each of the two measured voltage values from the different points in time. Stated differently, and as discussed above in association with FIG. 3, the voltage of the battery 13 varies as a function of temperature. Thus, since successive measurements were likely taken at different ambient temperatures, the voltage values must be normalized with respect to temperature in order to permit an accurate determination of the voltage change. This calculated voltage change represents how much the voltage dropped in response to the fixed amount of charge that was drained from the battery during the time interval.

In block 172, the program checks to see whether the calculated voltage change is greater than a threshold value. As discussed above in association with FIG. 2, the battery voltage decreases at a relatively low rate, until the battery 13 is almost completely discharged. Then, there is a sudden increase in the rate of voltage decrease. In block 172, the control circuit 12 is looking for this sudden increase in the rate of voltage decrease, in order to determine whether the battery 13 has reached a state where it is almost fully discharged.

If it is determined in block 172 that the calculated voltage change is less than the threshold value, then the discharge state of the battery has not yet reached the knee or corner of the discharge curve shown in FIG. 2. The program therefore proceeds to block 163, where it exits the interrupt service routine of FIG. 5, in order to resume execution of the main loop 104 of FIG. 4 from the point where that main routine was interrupted. On the other hand, if it is determined in block 172 that the calculated voltage change is greater than the threshold, then the discharge state of the battery has reached or passed the knee or corner of the discharge curve shown in FIG. 2, and the battery voltage is starting to drop more rapidly. The program therefore proceeds to block 173, where it sets the low battery flag, and then proceeds to block 163 to exit the interrupt service routine.

With reference to FIG. 5, the disclosed embodiment basically uses the low battery flag to provide an indication that the battery 13 either is still sufficiently charged, or has become sufficiently discharged that it should be replaced however, the cumulative current drain calculated in block 146 is effectively a representation of the percentage of battery discharge. Therefore, the calculated cumulative current drain could be used to provide an indication of the percentage of battery discharge.

With reference to FIG. 5, it should be noted that, in the portion of the flowchart that runs from block 138 to block 148, the program assumes that a battery inserted during battery replacement is always a fully charged battery. If a partially discharged battery is inserted, the amount of current drain needed to place it in a substantially discharged state will be less than the amount of current drain needed to place a fully charged battery in a substantially discharged state. Consequently, when a partially discharged battery is inserted, it will reach a substantially discharged state well before the program ever concludes at block 147 that there is a low battery condition. However, there are other portions of the interrupt service routine of FIG. 5, for example from block 127 to block 133 and from block 161 to block 173, that monitor the actual voltage of the battery, and that will detect when any battery has become substantially discharged, regardless of whether the battery was partially charged or fully charged at the time it was inserted.

Although one selected embodiment has been illustrated and described in detail, it should be understood that a variety of substitutions and alterations are possible without departing from the spirit and scope of the present invention, as defined by the following claims.

What is claimed is:

1. An apparatus comprising a battery and a circuit powered by said battery that has a plurality of different operating, modes, wherein said circuit:
   operates in each of said operating modes, starting from a point in time at which said battery is substantially fully charged, said circuit operating in one of said operating modes during each of a plurality of different time intervals that are spaced from each other in time;
   maintains a record of how long said circuit operates in each of said operating modes, starting from said point in time;
   calculates for each of said operating modes as a function of said record a cumulative current drain out of said battery from said point in time to a current time; and
   determines as a function of said cumulative current drains whether said battery presently has a low voltage condition;
   wherein said apparatus includes a radio frequency identification tag, said circuit and said battery being portions of said tag;
   wherein said tag has an antenna; and
   wherein said circuit has a transmitter coupled to said antenna, said circuit transmitting through said transmitter and said antenna a radio-frequency signal that indicates whether a determination has been made that said battery has a low battery condition.

2. An apparatus according to claim 1, wherein said battery is a lithium cell.

3. An apparatus according to claim 1, wherein said circuit:
   evaluates whether a rate of voltage decrease of said battery is in excess of a threshold; and
   determines that said battery presently has a low voltage condition when said rate of voltage decrease exceeds said threshold.

4. An apparatus according to claim 1, wherein said circuit:
   determines a respective current drain rate for each of said operating modes; and
   carries out said calculating of respective said cumulative current drains as a function of respective said current drain rates.

5. An apparatus according to claim 1, wherein said circuit effects said determining of whether said battery presently has a low voltage condition in a manner that includes evaluating a discharge specification for said battery in relation to current drain information that is a function of said cumulative current drains.

6. An apparatus comprising a battery and a circuit powered by said battery that has a plurality of different operating modes, wherein said circuit:
   operates in each of said operating modes, starting from a point in time at which said battery is substantially fully charged, said circuit operating in one of said operating modes during each of a plurality of different time intervals that are spaced from each other in time;
   maintains a record of how long said circuit operates in each of said operating modes, starting from said point in time;
   calculates for each of said operating modes as a function of said record a cumulative current drain out of said battery from said point in time to a current time;
   determines as a function of said cumulative current drains whether said battery presently has a low voltage condition;
   evaluates whether a rate of voltage decrease of said battery is in excess of a threshold; and
   determines that said battery presently has a low voltage condition when said rate of voltage decrease exceeds said threshold;
   wherein said circuit effects said evaluation of said rate of decrease of said voltage by:
      tracking the drain of charge from said battery;
      determining a series of points in time for which a substantially equal amount of charge is drained from said battery between each pair of successive said points in time;
      sampling said voltage of said battery at each of said points in time;

calculating the difference between said voltage samples from successive said points in time; and comparing the calculated difference to said threshold.

7. An apparatus comprising a battery and a circuit powered by said battery that has a plurality of different operating modes, wherein said circuit:

operates in each of said operating modes, starting from a point in time at which said battery is substantially fully charged, said circuit operating in one of said operating modes during each of a plurality of different time intervals that are spaced from each other in time;

maintains a record of how long said circuit operates in each of said operating modes, starting from said point in time;

calculates for each of said operating modes as a function of said record a cumulative current drain out of said battery from said point in time to a current time; and determines as a function of said cumulative current drains whether said battery presently has a low voltage condition;

wherein said apparatus includes a radio frequency identification tag, said circuit and said battery being portions of said tag;

wherein said circuit has a transmitter and a receiver; and wherein said operating modes of said circuit include a transmit mode in which said transmitter is enabled and said receiver is disabled, a receive mode in which said transmitter is disabled and said receiver is enabled, and a standby mode in which said transmitter and receiver are both disabled.

8. A method comprising:

operating a circuit in each of a plurality of different operating modes, starting from a point in time at which a battery that powers said circuit is substantially fully charged, including operating said circuit in one of said operating modes during each of a plurality of different time intervals that are spaced from each other in time;

causing said circuit to maintain a record of the cumulative amount of time that said circuit has operated in each of said operating modes, starting from said point in time;

calculating for each of said operating modes as a function of said record a cumulative current drain out of said battery from said point in time to a current time;

determining as a function of said cumulative current drains whether said battery presently has a low voltage condition;

providing a radio frequency identification tag, said circuit being a portion of said tag; and configuring said tag to have an antenna and said circuit to have a transmitter coupled to said antenna, said circuit transmitting through said transmitter and said antenna a radio frequency signal that indicates whether a determination has been made that said battery has a low battery condition.

9. A method according to claim 8, including:

determining a respective current drain rate for each of said operating modes; and carrying out said calculating of respective said cumulative current drains as a function of respective said current drain rates.

10. A method according to claim 8, wherein said determining includes evaluating a discharge specification for said battery in relation to current drain information that is a function of said cumulative current drains.

11. A method according to claim 8, including selecting a lithium cell to serve as said battery.

12. A method according to claim 8, including:

evaluating whether a rate of voltage decrease of said battery is in excess of a threshold; and indicating that said battery presently has a low voltage condition when said rate of voltage decrease exceeds said threshold.

13. A method comprising:

operating a circuit in each of a plurality of different operating modes, starting from a point in time at which a battery that powers said circuit is substantially fully charged, including operating said circuit in one of said operating modes during each of a plurality of different time intervals that are spaced from each other in time;

causing said circuit to maintain a record of the cumulative amount of time that said circuit has operated in each of said operating-modes, starting from said point in time;

calculating for each of said operating modes as a function of said record a cumulative current drain out of said battery from said point in time to a current time;

determining as a function of said cumulative current drains whether said battery presently has a low voltage condition;

providing a radio frequency identification tag, said circuit being a portion of said tag configuring said circuit to have a transmitter and a receiver; and configuring said operating modes of said circuit to include a transmit mode in which said transmitter is enabled and said receiver is disabled, a receive mode in which said transmitter is disabled and said receiver is enabled, and a standby mode in which said transmitter and receiver are both disabled.

14. A method comprising:

operating a circuit in each of a plurality of different operating modes, starting from a point in time at which a battery that powers said circuit is substantially fully charged, including operating said circuit in one of said operating modes during each of a plurality of different time intervals that are spaced from each other in time;

causing said circuit to maintain a record of the cumulative amount of time that said circuit has operated in each of said operating modes, starting from said point in time;

calculating for each of said operating modes as a function of said record a cumulative current drain out of said battery from said point in time to a current time;

determining as a function of said cumulative current drains whether said battery presently has a low voltage condition;

evaluating whether a rate of voltage decrease of said battery is in excess of a threshold, wherein said evaluating includes: tracking the drain of charge from said battery;

indicating that said battery presently has a low voltage condition when said rate of voltage decrease exceeds said threshold;

determining a series of points in time for which a substantially equal amount of charge is drained from said battery between each pair of successive said points in time;

sampling said voltage of said battery at each of said points in time;

calculating the difference between said voltage samples from successive said points in time; and comparing the calculated difference to said threshold.

15. A method according to claim 14, including providing a radio frequency identification tag, said circuit being a portion of said tag.

* * * * *